(12) United States Patent
Cao et al.

(10) Patent No.: US 11,736,825 B2
(45) Date of Patent: Aug. 22, 2023

(54) RADIATION DETECTORS WITH HIGH PIXEL CONCENTRATIONS

(71) Applicant: Shenzhen Genorivision Technology Co. Ltd., Shenzhen (CN)

(72) Inventors: Peiyan Cao, Shenzhen (CN); Yurun Liu, Shenzhen (CN)

(73) Assignee: SHENZHEN GENORIVISION TECHNOLOGY CO. LTD., Shenzhen (CN)

(*) Notice: Subject to any disclaimer, the term of this patent is extended or adjusted under 35 U.S.C. 154(b) by 0 days.

(21) Appl. No.: 17/863,776

(22) Filed: Jul. 13, 2022

(65) Prior Publication Data
US 2022/0353443 A1 Nov. 3, 2022

Related U.S. Application Data

(63) Continuation of application No. PCT/CN2020/076952, filed on Feb. 27, 2020.

(51) Int. Cl.
| | |
|---|---|
| H04N 5/3745 | (2011.01) |
| H01L 27/146 | (2006.01) |
| H04N 25/53 | (2023.01) |
| H04N 25/772 | (2023.01) |

(52) U.S. Cl.
CPC ....... *H04N 25/53* (2023.01); *H01L 27/14634* (2013.01); *H01L 27/14636* (2013.01); *H01L 27/14641* (2013.01); *H04N 25/772* (2023.01); *H01L 27/14658* (2013.01)

(58) Field of Classification Search
None
See application file for complete search history.

(56) References Cited

U.S. PATENT DOCUMENTS

| | | | |
|---|---|---|---|
| 2013/0112886 A1* | 5/2013 | Shin | H01L 27/14614 250/214 R |
| 2013/0136234 A1 | 5/2013 | Noma et al. | |
| 2014/0263952 A1* | 9/2014 | Taghibakhsh | H04N 5/378 250/214 DC |
| 2015/0281601 A1* | 10/2015 | Ganapathi | H01L 27/14632 438/66 |
| 2017/0099422 A1* | 4/2017 | Goma | H04N 5/37455 |
| 2018/0240837 A1 | 8/2018 | Chen et al. | |
| 2019/0014273 A1* | 1/2019 | Geurts | H04N 5/3532 |

FOREIGN PATENT DOCUMENTS

| | | |
|---|---|---|
| CN | 1574375 A | 2/2005 |
| CN | 101034163 A | 9/2007 |
| CN | 101584203 A | 11/2009 |
| CN | 101960331 A | 1/2011 |
| CN | 208537452 U | 2/2019 |
| WO | 2019244514 A1 | 12/2019 |

* cited by examiner

*Primary Examiner* — Mark T Monk
(74) *Attorney, Agent, or Firm* — IPro, PLLC; Qian Gu

(57) ABSTRACT

Disclosed herein is a method of operating a radiation detector, comprising for i=1, ..., N, during a transfer period (i), electrically connecting pixel (1,i) of pixels (1,j), j=1, ..., N of the radiation detector to a first signal processing circuit while electrically disconnecting the other N-1 pixels of the pixels (1,j), j=1, ..., N from the first signal processing circuit; and for i=1, ..., N, during the transfer period (i), transferring electrical signals from the pixel (1,i) to the first signal processing circuit.

19 Claims, 7 Drawing Sheets

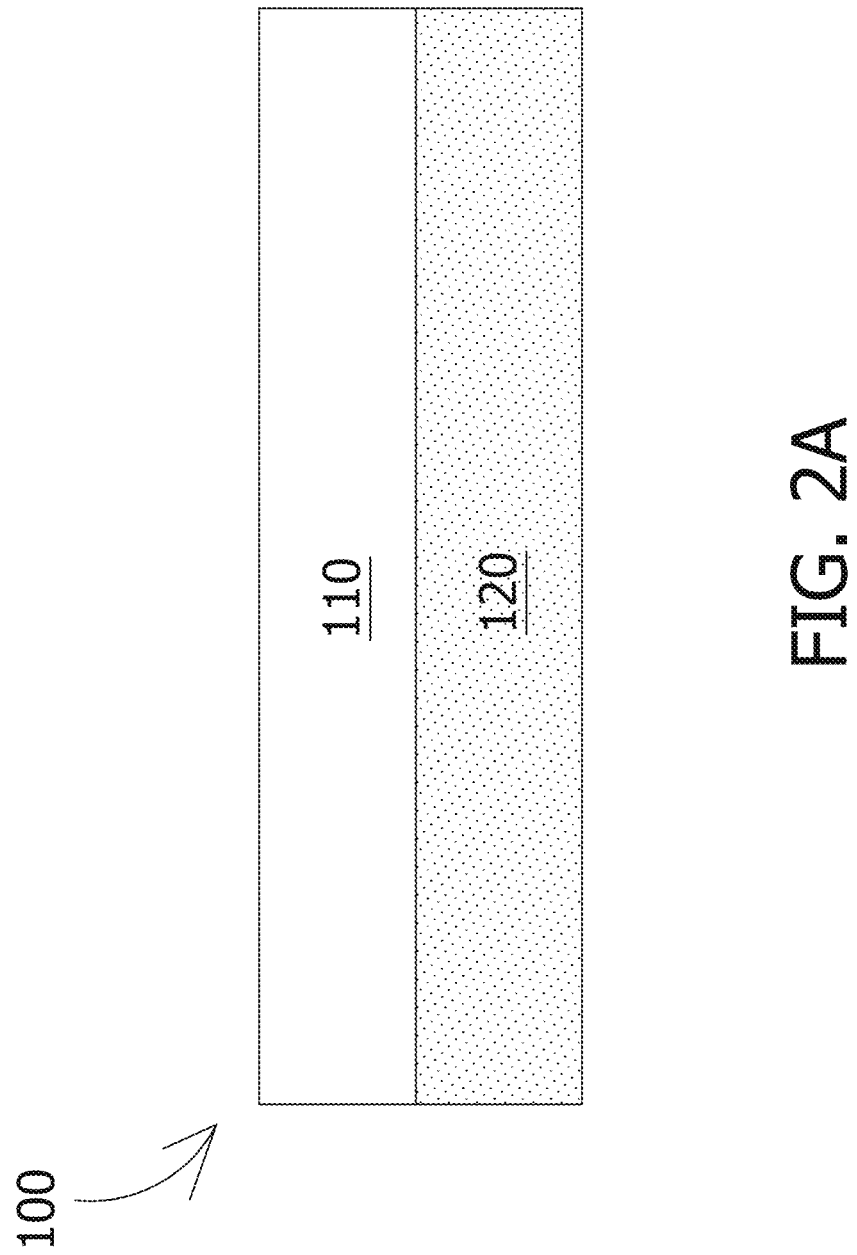

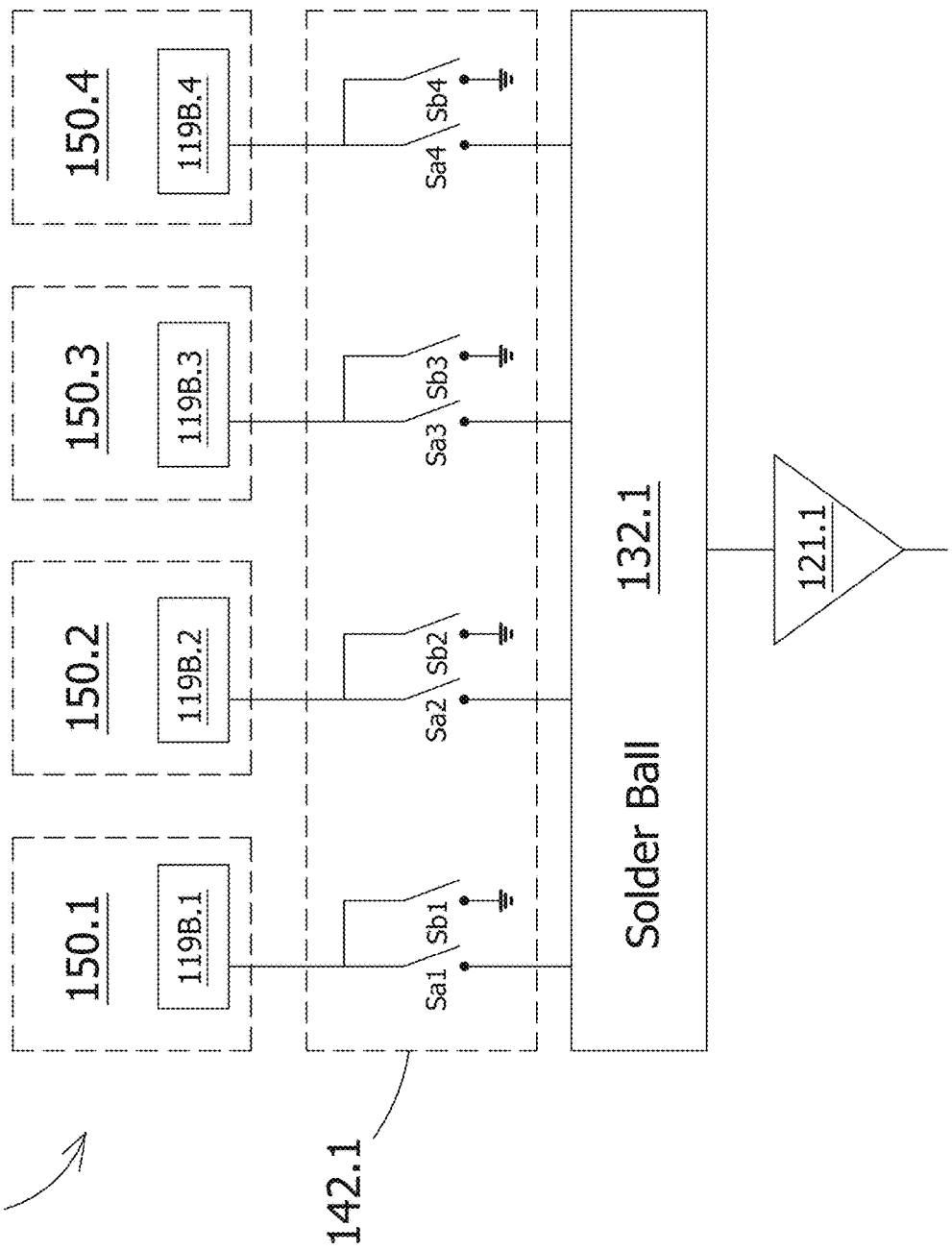

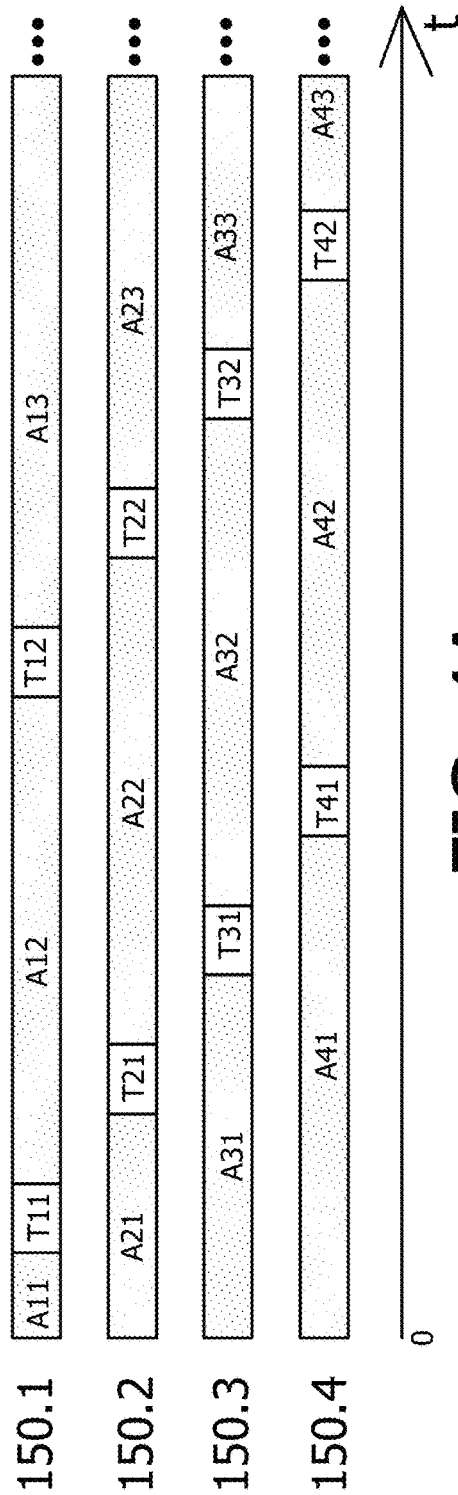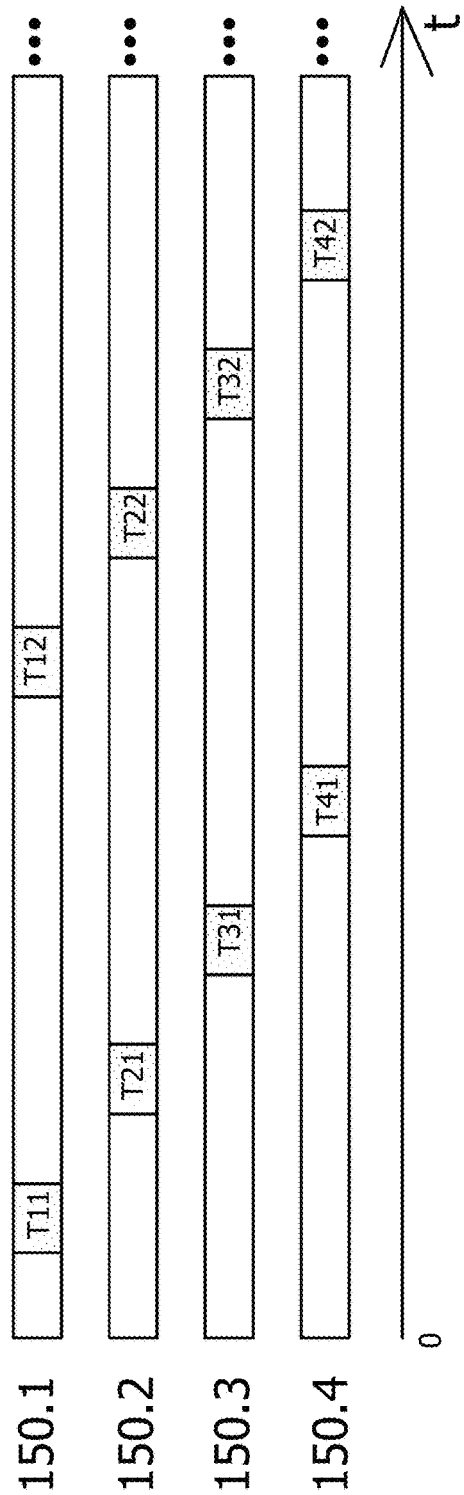

RADIATION DETECTORS WITH HIGH PIXEL CONCENTRATIONS

TECHNICAL FIELD

The disclosure herein relates to radiation detectors (or image sensors), and particularly relates to radiation detectors with high pixel concentrations.

BACKGROUND

A radiation detector is a device that measures a property of a radiation. Examples of the property may include a spatial distribution of the intensity, phase, and polarization of the radiation. The radiation may be one that has interacted with an object. For example, the radiation measured by the radiation detector may be a radiation that has penetrated the object. The radiation may be an electromagnetic radiation such as infrared light, visible light, ultraviolet light, X-ray or γ-ray. The radiation may be of other types such as α-rays and β-rays. The radiation may comprise radiation particles such as photons (electromagnetic waves) and subatomic particles.

The quality of an image captured by a radiation detector (or image sensor) depends on the number of pixels in the radiation detector. The larger the number of pixels, the better the quality of the image. There is always a need to increase the pixel concentration (number of pixels in a unit area) of the radiation detector so as to increase the resolution (hence quality) of the image captured by the radiation detector.

SUMMARY

Disclosed herein is a radiation detector, comprising a first detector portion which comprises pixels (1,j), j=1, . . . , N, wherein N is an integer greater than 1; a first switching device electrically connected to the pixels (1,j), j=1, . . . , N; and a first signal processing circuit electrically connected to the first switching device, wherein, for i=1, . . . , N, during a transfer period (i), the first switching device is configured to (a) electrically connect the pixel (1,i) to the first signal processing circuit and (b) electrically disconnect the other N−1 pixels of the pixels (1,j), j=1, . . . , N from the first signal processing circuit.

According to an embodiment, N=4.

According to an embodiment, the radiation detector further comprises a second detector portion which comprises pixels (2,j), j=1, . . . , N, a second switching device electrically connected to the pixels (2,j), j=1, . . . , N, and a second signal processing circuit electrically connected to the second switching device, wherein, for i=1, . . . , N, during the transfer period (i), the second switching device is configured to (a) electrically connect the pixel (2,i) to the second signal processing circuit and (b) electrically disconnect the other N−1 pixels of the pixels (2,j), j=1, . . . , N from the second signal processing circuit.

According to an embodiment, the first detector portion further comprises a solder ball, and the first switching device is electrically connected to the first signal processing circuit via the solder ball.

According to an embodiment, the first processing circuit comprises an analog-to-digital converter.

According to an embodiment, the first switching device comprises transfer electrical switches (i), i=1, . . . , N, and for i=1, . . . , N, the transfer electrical switch (i), when being on, is configured to electrically connect the pixel (1,i) to the first signal processing circuit.

According to an embodiment, each transfer electrical switch of the transfer electrical switches (i), i=1, . . . , N comprises a transistor.

According to an embodiment, for i=1, . . . , N, during a non-transfer non-accumulation period (i) immediately before the transfer period (i), the first switching device is configured to (a) electrically connect the pixel (1,i) to ground and (b) electrically disconnect the pixel (1,i) from the first signal processing circuit.

According to an embodiment, the first switching device comprises ground electrical switches (i), i=1, . . . , N, and for i=1, . . . , N, the ground electrical switch (i), when being on, is configured to electrically connect the pixel (1,i) to ground.

According to an embodiment, the radiation detector further comprises a shutter which is configured to expose the pixels (1,j), j=1, . . . , N to an incident radiation during an open shutter time window which is before the transfer periods (i), i=1, . . . , N.

Disclosed herein is a method of operating a radiation detector, comprising for i=1, . . . , N, during a transfer period (i), electrically connecting pixel (1,i) of pixels (1,j), j=1, . . . , N of the radiation detector to a first signal processing circuit while electrically disconnecting the other N−1 pixels of the pixels (1,j), j=1, . . . , N from the first signal processing circuit; and for i=1, . . . , N, during the transfer period (i), transferring electrical signals from the pixel (1,i) to the first signal processing circuit.

According to an embodiment, the method further comprises for i=1, . . . , N, during the transfer period (i), electrically connecting pixel (2,i) of pixels (2,j), j=1, . . . , N of the radiation detector to a second signal processing circuit while electrically disconnecting the other N−1 pixels of the pixels (2,j), j=1, . . . , N from the second signal processing circuit; and for i=1, . . . , N, during the transfer period (i), transferring electrical signals from the pixel (2,i) to the second signal processing circuit.

According to an embodiment, said electrically connecting while electrically disconnecting and said transferring for i=1, . . . , N are performed K times in a round-robin manner, K being an integer greater than 1.

According to an embodiment, the first processing circuit comprises an analog-to-digital converter.

According to an embodiment, the method further comprises opening a shutter of the radiation detector during an open shutter time window before the transfer periods (i), i=1, . . . , N; and exposing the pixels (1,j), j=1, . . . , N to an incident radiation through the shutter during the open shutter time window.

According to an embodiment, the method further comprises using an electronics system of the radiation detector to process (a) the electrical signals from the pixels (1,j), j=1, . . . , N and (b) other electrical signals from other pixels of the radiation detector to form an image of a scene.

According to an embodiment, the radiation detector comprises a first switching device, and for i=1, . . . , N, during the transfer period (i), said electrically connecting while electrically disconnecting comprises using the first switching device to electrically connect the pixel (1,i) to the first signal processing circuit while causing the first switching device to not electrically connect the other N−1 pixels of the pixels (1,j), j=1, . . . , N to the first signal processing circuit.

According to an embodiment, the first signal processing circuit is electrically connected to the first switching device via a solder ball.

According to an embodiment, (a) the first switching device comprises transfer electrical switches (j), j=1, . . . , N, (b) for i=1, . . . , N, the transfer electrical switch (i), when being on, is configured to electrically connect the pixel (1,i) to the first signal processing circuit, and (c) for i=1, ..., N, said using while causing the first switching device during the transfer period (i) comprises turning on the transfer electrical switch (i) while turning off the other N−1 transfer electrical switches of the transfer electrical switches (j), j=1, ..., N during the transfer period (i).

According to an embodiment, the method further comprises for i=1, ..., N, during a non-accumulation non-transfer period (i) immediately before the transfer period (i), using the first switching device to (a) electrically connect the pixel (1,i) to ground and (b) electrically disconnect the pixel (1,i) from the first signal processing circuit.

According to an embodiment, the first switching device comprises ground electrical switches (i), i=1, ..., N, and for i=1, ..., N, said using the first switching device during the non-accumulation non-transfer period (i) comprises turning on the ground electrical switch (i) during the non-accumulation non-transfer period (i) so as to electrically connect the pixel (1,i) to ground.

BRIEF DESCRIPTION OF FIGURES

FIG. 2A schematically shows a simplified cross-sectional view of the radiation detector of FIG. 1, according to an embodiment.

FIG. 3 schematically shows a detector portion of the radiation detector of FIG. 2B, according to an embodiment.

FIGS. 4A, 4B, & 4C show timing diagrams illustrating operations of the radiation detector, according to different embodiments.

DETAILED DESCRIPTION

Figure 1:
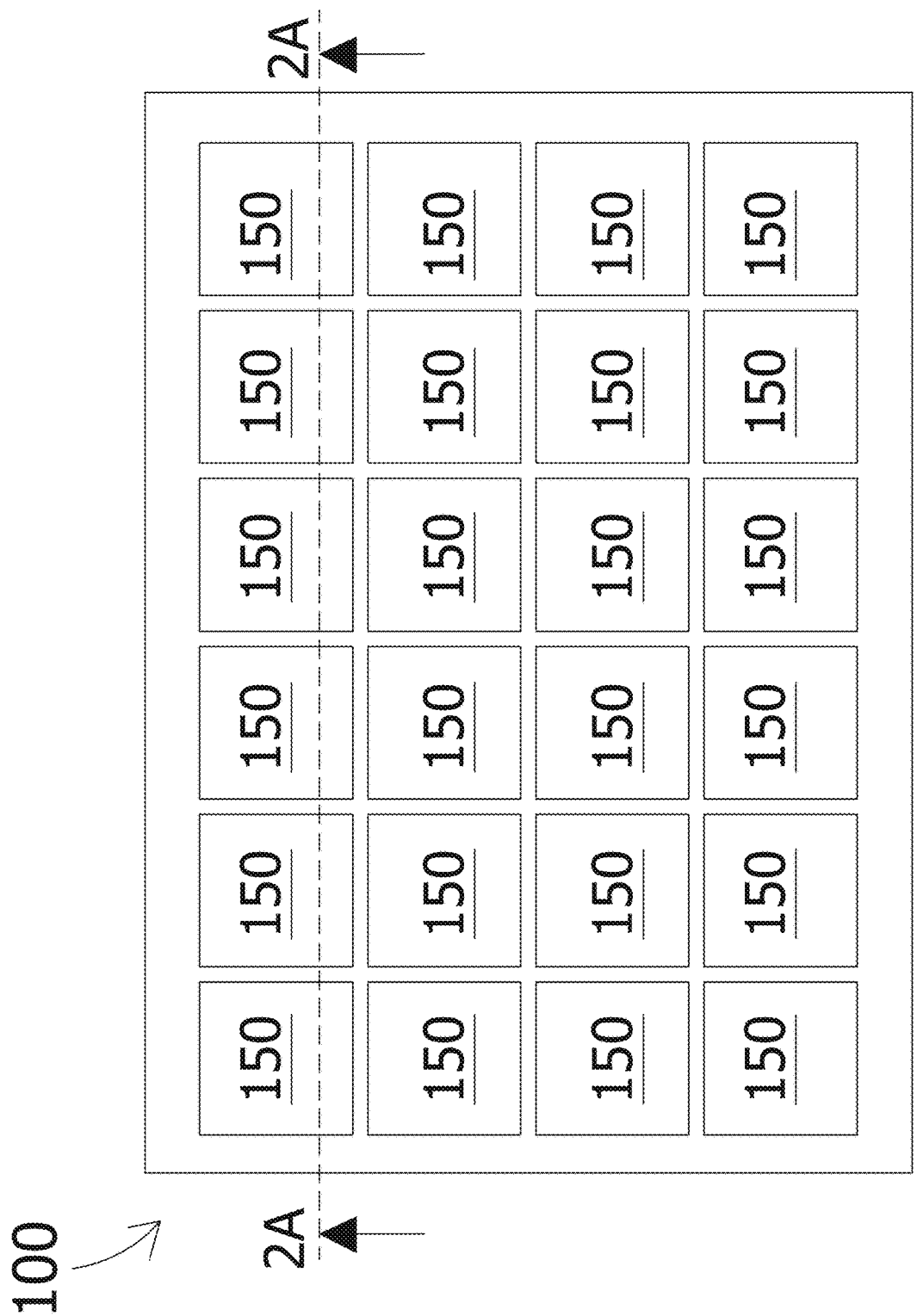
FIG. 1 schematically shows a top view of a radiation detector, according to an embodiment.

FIG. 1 schematically shows a top view of a radiation detector 100, in an embodiment. Specifically, the radiation detector 100 may include an array of pixels 150. The array may be a rectangular array (as shown in FIG. 1), a honeycomb array, a hexagonal array or any other suitable array. The radiation detector 100 of FIG. 1 includes 24 pixels 150 arranged in a rectangular array of 4 rows and 6 columns; however, in general, the radiation detector 100 may have any number of pixels 150 arranged in any way.

Each pixel 150 may be configured to detect radiation from a radiation source incident thereon and may be configured to measure a characteristic (e.g., the energy of the particles, the wavelength, and the frequency) of the radiation. For example, each pixel 150 may be configured to count numbers of particles of radiation incident thereon whose energy falls in a plurality of bins of energy, within a period of time. All the pixels 150 may be configured to count the numbers of particles of radiation incident thereon within a plurality of bins of energy within the same period of time.

Each pixel 150 may have its own analog-to-digital converter (ADC) configured to digitize an analog signal representing the energy of an incident particle of radiation into a digital signal, or to digitize an analog signal representing the energy of an incident particle of radiation into a digital signal. The pixels 150 may be configured to operate in parallel. For example, when one pixel 150 measures an incident particle of radiation, another pixel 150 may be waiting for a particle of radiation to arrive. The pixels 150 may not have to be individually addressable.

The radiation detector 100 described here may have applications such as in an X-ray telescope, X-ray mammography, industrial X-ray defect detection, X-ray microscopy or microradiography, X-ray casting inspection, X-ray non-destructive testing, X-ray weld inspection, X-ray digital subtraction angiography, etc. It may be suitable to use this radiation detector 100 in place of a photographic plate, a photographic film, a PSP plate, an X-ray image intensifier, a scintillator, or another semiconductor X-ray detector. The radiation detector 100 may also be used as an image sensor that captures an image of an object or a scene by detecting visible light photons.

FIG. 2A schematically shows a simplified cross-sectional view of the radiation detector 100 of FIG. 1 along a line 2A-2A, according to an embodiment. Specifically, the radiation detector 100 may include a radiation absorption layer 110 and an electronics layer 120 (e.g., an ASIC) for processing or analyzing electrical signals which incident radiation generates in the radiation absorption layer 110. The radiation detector 100 may or may not include a scintillator (not shown). The radiation absorption layer 110 may comprise a semiconductor material such as, silicon, germanium, GaAs, CdTe, CdZnTe, or a combination thereof. The semiconductor material may have a high mass attenuation coefficient for the radiation of interest.

Figure 2B:
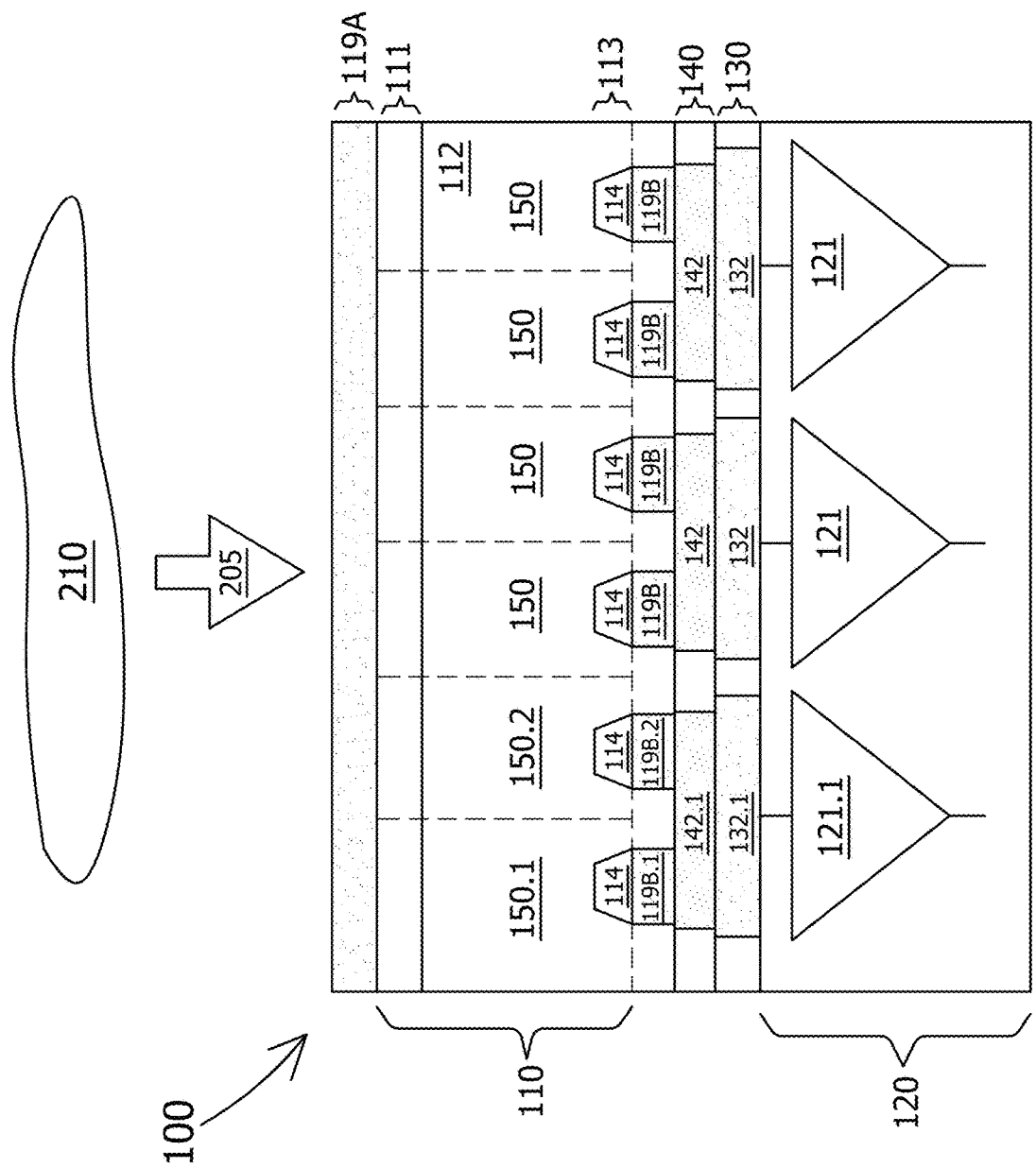
FIG. 2B schematically shows one embodiment of the radiation detector of FIG. 2A.

FIG. 2B schematically shows a detailed view of the radiation detector 100 of FIG. 2A, in an embodiment. It should be noted that in this and subsequent figures, some components have reference numerals with extensions. These extensions are added just to facilitate the identification of these components. For example, pixel 150.1 is just like the other pixels 150. The extension "0.1" is added to "150" just to facilitate the identification of that particular pixel 150.1. As a result, "pixels 150" refers to all pixels 150 including pixel 150.1; but the "pixel 150.1" refers to only that pixel 150.1, not any other pixel 150.

In an embodiment, the radiation absorption layer 110 may include one or more diodes (e.g., p-i-n or p-n junctions) formed by a first doped region 111 and one or more discrete regions 114 of a second doped region 113. The second doped region 113 may be separated from the first doped region 111 by an optional intrinsic region 112. The discrete portions 114 are separated from one another by the first doped region 111 or the intrinsic region 112. The first doped region 111 and the second doped region 113 have opposite types of doping (e.g., region 111 may be p-type and region 113 may be n-type, or region 111 may be n-type and region 113 may be p-type).

In an embodiment, each of the discrete regions 114 of the second doped region 113 forms a diode with the first doped region 111 and the optional intrinsic region 112. Namely, in FIG. 2B, the radiation absorption layer 110 has a plurality of diodes corresponding to the same number of pixels 150. More specifically, although only 6 diodes corresponding to 6 pixels 150 are shown in FIG. 2B, there are in total 24 diodes corresponding to the 24 pixels 150 of FIG. 1. The plurality of diodes may have an electrode 119A as a shared (common) electrode which may comprise polysilicon. The first doped region 111 may also have discrete portions.

In an embodiment, the electronics layer 120 may include an electronic system suitable for processing or interpreting electrical signals (i.e., the charge carriers) generated in the pixels 150 by the radiation incident on the radiation absorption layer 110. The electronic system may include analog circuitry such as a filter network, amplifiers, integrators, and comparators, or digital circuitry such as a microprocessor, and memory. The electronic system may include one or more ADCs.

The electronic system may include (a) components each of which is shared by all the pixels 150 and (b) components each of which is dedicated to a group of pixels 150 (a group of pixels 150 may include one or more but not all pixels 150). For example, the electronic system may include a microprocessor shared among all the pixels 150. For another example, the electronic system may include signal processing circuits 121 each of which is dedicated to a group of pixels 150. Each signal processing circuit 121 may include an analog-to-digital converter dedicated to the group of pixels 150.

When radiation from the radiation source (not shown) hits the radiation absorption layer 110, the radiation photons may be absorbed and generate one or more charge carriers (e.g., electrons, holes) by a number of mechanisms. The charge carriers may drift to the electrodes of one of the diodes/pixels 150 under an electric field. The electric field may be an external electric field. The electrical contacts 119B may include discrete portions which are in electrical contact with the discrete regions 114. The term "electrical contact" may be used interchangeably with the word "electrode."

In an embodiment, the charge carriers may drift in directions such that the charge carriers generated by a single particle of the radiation are not substantially shared by two different discrete regions 114 ("not substantially shared" here means less than 2%, less than 0.5%, less than 0.1%, or less than 0.01% of these charge carriers flow to a different one of the discrete regions 114 than the rest of the charge carriers). Charge carriers generated by a particle of the radiation incident around the footprint of one of these discrete regions 114 are not substantially shared with another of these discrete regions 114. A pixel 150 associated with a discrete region 114 may be an area around the discrete region 114 in which substantially all (more than 98%, more than 99.5%, more than 99.9%, or more than 99.99% of) charge carriers generated by a particle of the radiation incident therein flow to the discrete region 114. Namely, less than 2%, less than 1%, less than 0.1%, or less than 0.01% of these charge carriers flow beyond the pixel 150.

In an embodiment, the radiation detector 100 may further comprise (a) a solder ball layer 130 which includes solder balls 132, and (b) a switch layer 140 which includes switch regions 142. During some transfer operations/periods, the switch regions 142 electrically connect the pixels 150 to the signal processing circuits 121 via the electrodes 119B and the solder balls 132.

Figure 2C:
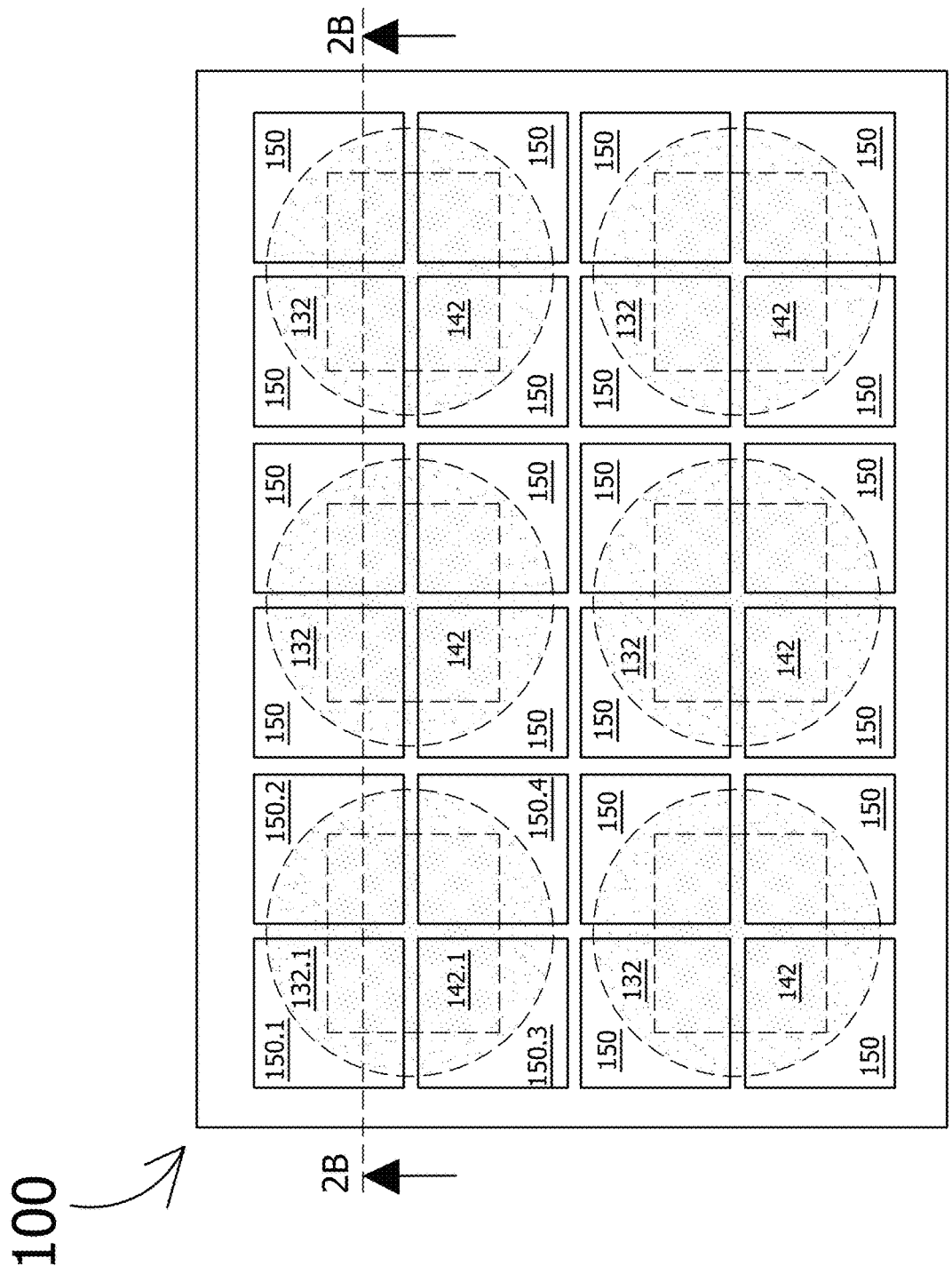
FIG. 2C schematically shows a top view of the radiation detector of FIG. 2B, according to an embodiment.

FIG. 2C schematically shows a top view of the radiation detector 100 of FIG. 2B, in an embodiment. For simplicity, only the pixels 150, the solder balls 132, and the switch regions 142 of the radiation detector 100 are shown in FIG. 2C (other components of the radiation detector 100 such as the signal processing circuits 121 and the electrodes 119B are not shown). It should be noted that FIG. 2B is a cross-sectional view of the radiation detector 100 of FIG. 2C along a line 2B-2B.

With reference to FIG. 2B and FIG. 2C, in an embodiment, the 24 pixels 150 of the radiation detector 100 may be divided into 6 groups, with 4 pixels 150 in each group. Each group may be connected to a signal processing circuit 121 via a switch region 142 and a solder ball 132. For example, the group of 4 pixels 150.1, 150.2, 150.3, and 150.4 (or 150.1-4 for short) may be connected to the signal processing circuit 121.1 via the switch region 142.1 and a solder ball 132.1. As a result, in total, the radiation detector 100 includes, among other things, the 24 pixels 150, the 24 electrodes 119B, the 6 switch regions 142, the 6 solder balls 132, and the 6 signal processing circuits 121. In an embodiment, each solder ball 132 may comprise an electrically conductive material such as a combination of lead (Pb) and tin (Sn).

In an embodiment, the formation of the radiation detector 100 of FIG. 2B may be as follows. First, a first substrate including a top portion of the radiation detector 100 and a second substrate including a bottom portion of the radiation detector 100 may be separately formed. Specifically, the first substrate may include the switch layer 140 and other layers above the switch layer 140, whereas the second substrate may include the electronics layer 120.

Next, the solder balls 132 may be formed on a top surface of the electronics layer 120 of the second substrate such that the solder balls 132 are electrically connected to the signal processing circuits 121. Next, the first and second substrates may be bonded together at a high temperature such that the solder balls 132 are electrically connected to the switch regions 142 on the first substrate. Any void spaces around the solder balls 132 after bonding may be filled with a dielectric material resulting in the solder ball layer 130 and also resulting in the radiation detector 100 of FIG. 2B.

With reference to FIG. 2B and FIG. 2C, the radiation detector 100 may be divided into 6 detector portions each of which includes a group of 4 pixels 150 and the associated switch region 142, solder ball 132 and signal processing circuit 121. One of the 6 detector portions is shown in FIG. 3 (i.e., detector portion 300) according to an embodiment. The other 5 detector portions are similar to the detector portion 300 in terms of structure and operation. Specifically, the detector portion 300 includes the 4 pixels 150.1-4, and their associated switch region 142.1, solder ball 132.1 and signal processing circuit 121.1.

In an embodiment, the switch region 142.1 may include 8 electrical switches Sa1, Sb1, Sa2, Sb2, Sa3, Sb3, Sa4, and Sb4. The electrical switches Sa1, Sa2, Sa3, and Sa4, when being on, electrically connect the electrodes 1196.1, 1196.2, 1196.3, and 1196.4 of the pixels 150.1, 150.2, 150.3, and 150.4 respectively to the signal processing circuit 121.1 via the solder ball 132.1. The electrical switches Sb1, Sb2, Sb3, and Sb4, when being on, electrically connect the electrodes 1196.1, 1196.2, 1196.3, and 1196.4 of the pixels 150.1, 150.2, 150.3, and 150.4 respectively to ground. In an embodiment, each of the 8 electrical switches Sa1, Sb1, Sa2, Sb2, Sa3, Sb3, Sa4, and Sb4 may be implemented using a junction field effect transistor (WET).

FIG. 4A schematically shows a first timing diagram illustrating the operation of the detector portion 300 of FIG. 3 (and also illustrating the operations of the other 5 detector portions of the radiation detector 100), according to an embodiment. The operation of the detector portion 300 according to the first timing diagram may be as follows.

Assume that the radiation detector 100 is exposed to an incident radiation 205 (FIG. 2B) which comes from an object (or scene) 210. Then, at time t=0, the radiation detector 100 is turned on.

Regarding the pixel 150.1, during the accumulation period (or accumulation operation) A11, the electrical switches Sa1 and Sb1 are off, and as a result, charge carriers created in the pixel 150.1 accumulate in the pixel 150.1. Then, during the transfer period (or transfer operation) T11, the electrical switch Sa1 is on and the electrical switch Sb1 is off. As a result, the charge carriers accumulated in the pixel 150.1 during the accumulation period A11 and during the transfer period T11 are transferred through the electrical switch Sa1 to the solder ball 132.1 and then to the signal processing circuit 121.1 and to other components of the electronic layers 120 for processing. At the end of the transfer period/operation T11, there is no charge carriers in the pixel 150.1 (because the transfer operation T11 drains all the charge carriers in the pixels 150.1).

The other accumulation operations on the pixel 150.1 (A12, A13, and others afterwards) are similar to the accumulation operation A11. The other transfer operations on the pixel 150.1 (T12 and others afterwards) are similar to the transfer operation T11. The accumulation operations and the transfer operations on the other pixels 150.2-4 of the detector portion 300 are similar to the accumulation operations and the transfer operations on the pixel 150.1.

In an embodiment, the transfer operations on the pixels 150.1-4 are performed in turns in a round-robin manner as can be seen in FIG. 4A. Specifically, transfer operations are performed on pixel 150.1 (T11), then on pixel 150.2 (T21), then on pixel 150.3 (T31), then on pixel 150.4 (T41), then on pixel 150.1 again (T12), then on pixel 150.2 again (T22), then on pixel 150.3 again (T32), then on pixel 150.4 again (T42), and so on.

It should be noted that, while a transfer operation on a pixel of the 4 pixels 150.1-4 of the detector portion 300 is performed, the switch region 142.1 electrically connects only that pixel to the signal processing circuit 121.1 while the switch region 142.1 electrically disconnects the other 3 pixels of the pixels 150.1-4 from the signal processing circuit 121.1 (i.e., while the switch region 142.1 does not electrically connect the other 3 pixels of the pixels 150.1-4 to the signal processing circuit 121.1). It should also be noted that during the operation of the detector portion 300 according to the first timing diagram, the 4 electrical switches Sb1, Sb2, Sb3, and Sb4 are always off, and therefore may be omitted if the radiation detector 100 is to operate according to the first timing diagram.

In an embodiment, except for the first cycle (A11, A21, A31, and A41), all accumulation operations are the same in duration, and all transfer operations are the same in duration. For example, the accumulation operations A12 and A22 are the same in duration. For another example, the transfer operations T12 and T22 are the same in duration. These conditions ensure that, for any transfer operation on any pixel, the pixel has the same radiation exposure time.

In an embodiment, 6 transfer operations may be performed simultaneously on 6 pixels 150 on the 6 detector portions of the radiation detector 100 at a time (basically, the relative timing of the operations of the 6 detector portions does not have to be synchronized). Specifically, assume the $2^{nd}$, $3^{rd}$, $4^{th}$, $5^{th}$, and $6^{th}$ detector portions of the radiation detectors include the pixels 150.5-8, 150.9-12, 150.13-16, 150.17-20, and 150.21-24, respectively. Then, for i=1, ..., 4, the transfer operations on the pixels 150.i, 150.(i+4), 150.(i+8), 150.(i+12), 150.(i+16), and 150.i+20 may be performed simultaneously. For example, for i=1, the 6 transfer operations on the pixels 150.1, 150.5, 150.9, 150.13, 150.17, and 150.21 may be performed simultaneously. In other words, whenever a transfer operation on the pixel 150.1 is performed, then 5 other transfer operations on the pixels 150.5, 150.9, 150.13, 150.17, and 150.21 may be also performed at the same time as the transfer operation on the pixel 150.1. In an embodiment, the operations of the other 5 detector portions of the radiation detector 100 may be similar to the operation of the detector portion 300.

In an embodiment, after each round of 24 transfer operations on the 24 pixels of the radiation detector 100, the electronics layer 120 and a computer may process the electrical signals from the 24 transfer operations to form an image of 24 corresponding regions on the object (or scene) 210. For example, in the first timing diagram, an image forming operation may be performed after the transfer operation T42 so as to process the electrical signals from the 24 transfer operations (including T12, T22, T32, and T42 for the detector portion 300) to form an image of 24 corresponding regions on the object (or scene) 210. In an embodiment, the image resulting from the preceding image forming operation which is performed after the transfer operation T41 may be ignored because the 24 preceding accumulation periods (including A11, A21, A31, and A41 for the detector portion 300) are not the same in duration.

FIG. 4B schematically shows a second timing diagram illustrating the operation of the detector portion 300 of FIG. 3 (and also illustrating the operations of the other 5 detector portions of the radiation detector 100), according to an alternative embodiment. It should be noted that if each accumulation period (e.g., A11, A12, etc.) of the first timing diagram of FIG. 4A is changed into a non-transfer, non-accumulation period, then the result is the second timing diagram of FIG. 4B.

In an embodiment, the operation of the radiation detector 100 according to the second timing diagram of FIG. 4B may be similar to the operation of the radiation detector 100 according to the first timing diagram of FIG. 4A. For an example of the similarity, the transfer operations on the pixels 150 of each detector portion (e.g., detector portion 300) according to the second timing diagram are also in a round-robin manner. For another example of the similarity, during a transfer operation on a pixel 150, the associated switch Sa is on, and the associated switch Sb is off (e.g., during a transfer operation of the pixel 150.1, the switch Sa1 is on, and the switch Sb1 is off). For yet another example of the similarity, an image forming operation can be performed after each round of 24 transfer operations on the 24 pixels 150 of the radiation detector 100 (e.g., an image forming operation can be performed after the transfer operation T42 in the second timing diagram).

In an embodiment, an exception to the similarity is that during the non-transfer non-accumulation periods of a pixel 150 of the radiation detector 100, the pixel is electrically grounded and electrically disconnected from the associated solder ball and the associated signal processing circuit (its associated switch Sa is off, and its associated switch Sb is on). For example, during non-transfer non-accumulation periods of the pixel 150.1, the switch Sa1 is off, and the switch Sb1 is on. As a result, the pixel 150.1 is electrically grounded and electrically disconnected from the solder ball 132.1 and the associated signal processing circuit 121.1. This means that during these non-transfer non-accumulation periods of a pixel 150, all charge carriers created in the pixel are immediately drained to ground.

Figure 4C:
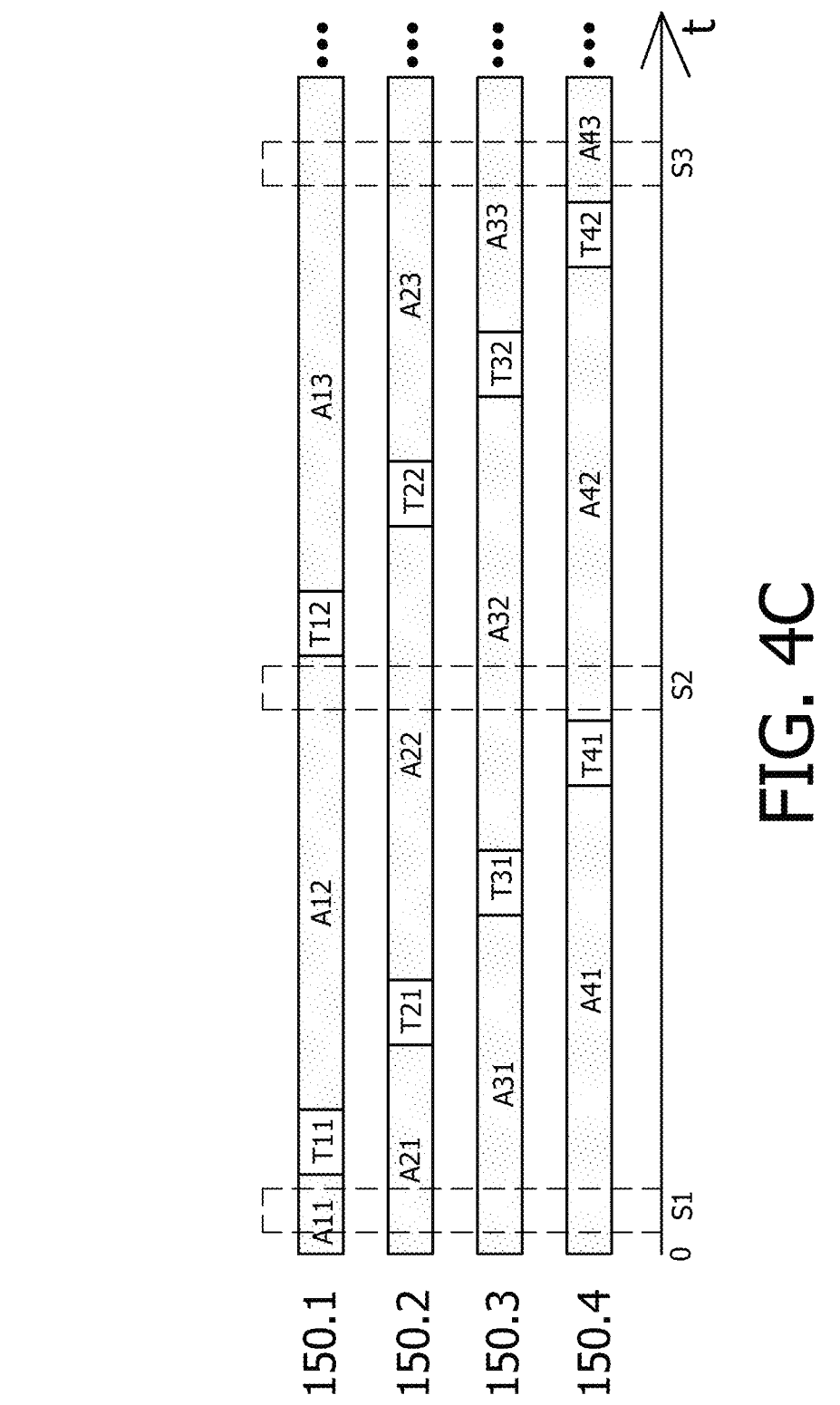

FIG. 4C schematically shows a third timing diagram illustrating the operation of the detector portion 300 of FIG. 3 (and also illustrating the operations of the other 5 detector portions of the radiation detector 100), according to yet another alternative embodiment. It should be noted that the third timing diagram is the first timing diagram of FIG. 4A plus identical open shutter time windows (S1, S2, S3, and so on) imposed thereon right before each round of 4 transfer operations on the pixels 150.1-4, but after the preceding round of 4 transfer operations (if any). For example, open shutter time window S2 is before the 2nd round of 4 transfer operations T12, T22, T32, and T42 on the pixels 150.1-4, but after the 1st round of 4 transfer operations T11, T21, T31, and T41.

In an embodiment, the radiation detector 100 may include a shutter (not shown) which is open only during the open shutter time windows so as to expose the 24 pixels 150 to the incident radiation 205 (i.e., the pixels 150 are not exposed to the incident radiation 205 outside these open shutter time windows). As a result, the accumulation periods in the first timing diagram become ready-to-accumulate periods in the third timing diagram. In the third timing diagram, only portions of the ready-to-accumulate periods that are within the open shutter time windows are accumulation periods. For example, in the third timing diagram, the portion of the ready-to-accumulate period A11 which is within the open shutter time window S1 is an accumulation period/operation during which charge carriers (electrical signals) are generated and accumulate in the pixel 150.1 due to incident radiation 205.

In an embodiment, the operation of the radiation detector 100 according to the third timing diagram of FIG. 4C is similar to the operation of the radiation detector 100 according to the first timing diagram of FIG. 4A, except for the presence of the shutter which exposes the 24 pixels 150 of the radiation detector 100 to the incident radiation 205 only during the open shutter time windows S1, S2, S3, and so on.

The 24 pixels 150 of the radiation detector 100 are divided into 6 groups of 4 pixels 150 each. The 4 pixels 150 in each group share some components such as the signal processing circuit 121. As a result, each signal processing circuit 121 receives electrical signals from the 4 pixels 150 of the associated pixel group in turns (i.e., sequentially) via the associated solder ball 132 and with the help of the electrical switches of the associated switch region 142. In other words, the electrical switches of the associated switch region 142 electrically connect the 4 pixels 150 of the associated pixel group in turns (i.e., sequentially) to the associated signal processing circuit 121 during the transfer operations on these 4 pixels 150.

A pixel 150 thus can have a smaller footprint than a signal processing circuit 121. As shown in the examples herein, each signal processing circuit 121 is shared by 4 pixels 150 (e.g., in FIG. 3, the signal processing circuit 121.1 is shared by 4 pixels 150.1-4). As a result, the number of pixels 150 can be 4 times the number of the signal processing circuits 121. In other words, the radiation detector 100 of the present disclosure achieves a higher pixel density.

In the embodiments described above, the solder balls 132 are used in the formation of the radiation detector 100 from two separate first and second substrates. In an alternative embodiment, the first and second substrates may be bonded together by direct bonding (i.e., without the use of solder balls 132). In yet another alternative embodiment, only one substrate is used in the formation of the radiation detector 100. As a result, no solder balls 132 are needed. Specifically, in these alternative embodiments, with reference to FIG. 2B, the switch regions 142 may connect the electrodes 1196 of the pixels 150 directly to the signal processing circuits 121 without the solder balls 132 (hence without the solder ball layer 130). More specifically, in FIG. 3, the electrical switches Sa1, Sb1, Sa2, Sb2, Sa3, Sb3, Sa4, and Sb4 connect the electrodes 1196.1-4 directly to the signal processing circuits 121.1 without the solder ball 132.1. In an embodiment, the operation of radiation detector 100 in these alternative embodiments is similar to that in the embodiments where the solder balls 132 are present.

In the embodiments described above, the radiation detector 110 includes 24 pixels 150 divided into 6 groups of 4 pixels. In general, the radiation detector 110 may include any number of pixels 150 which may be divided into groups of any number of pixels 150. For example, the radiation detector 110 may include 36 pixels 150 divided into 4 groups of 9 pixels. As a result, there are 4 detector portions each of which includes 9 pixels 150, a switch region 142, a solder ball 132, and a signal processing circuit 121. In this case, each switch region 142 includes (a) 9 Sa switches which when being on electrically connect the 9 pixels 150 of the associated detector portion to the associated solder ball, and (b) 9 Sb switches which when being on electrically connect the 9 pixels 150 of the associated detector portion to ground. From the descriptions above, each switch region 142 operates as a switching device and therefore can also be referred to as a switching device 142.

In the embodiments described above, three timing diagrams (i.e., the first, second, and third timing diagrams) for the operation of the radiation detector 100 are described. In an embodiment, there may be a fourth timing diagram (not shown) for the operation of the radiation detector 100. Specifically, if each accumulation period (e.g., A11, A12, etc.) of the first timing diagram of FIG. 4A is entirely changed into a non-transfer, non-accumulation period, then the result is the second timing diagram of FIG. 4B as described above. Alternatively, if only a portion (of the same duration) of each accumulation period (e.g., A11, A12, etc.) of the first timing diagram of FIG. 4A is changed into a non-transfer, non-accumulation period, then the result is the fourth timing diagram.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A radiation detector, comprising a first detector portion which comprises:
   pixels (1,j), j=1, . . . , N, wherein N is an integer greater than 1;
   a first switching device electrically connected to the pixels (1,j), j=1, . . . , N; and
   a first signal processing circuit electrically connected to the first switching device,
   wherein, for i=1, . . . , N, during a transfer period (i), the first switching device is configured to (a) electrically connect the pixel (1,i) to the first signal processing circuit and (b) electrically disconnect the other N−1 pixels of the pixels (1,j), j=1, . . . , N from the first signal processing circuit;
   a second detector portion which comprises:
   pixels (2,j), j=1, . . . , N,
   a second switching device electrically connected to the pixels (2,j), i=1, . . . , N, and
   a second signal processing circuit electrically connected to the second switching device,
   wherein, for i=1, . . . , N, during the transfer period (i), the second switching device is configured to (a) electrically connect the pixel (2,i) to the second signal processing circuit and (b) electrically disconnect the other N−1 pixels of the pixels (2,j), j=1, . . . , N from the second signal processing circuit.

2. The radiation detector of claim 1, wherein N=4.

3. The radiation detector of claim 1,
   wherein the first detector portion further comprises a solder ball, and
   wherein the first switching device is electrically connected to the first signal processing circuit via the solder ball.

4. The radiation detector of claim 1, wherein the first processing circuit comprises an analog-to-digital converter.

5. The radiation detector of claim 1,
wherein the first switching device comprises transfer electrical switches (i), i=1, ..., N, and
wherein for i=1, ..., N, the transfer electrical switch (i), when being on, is configured to electrically connect the pixel (1,i) to the first signal processing circuit.

6. The radiation detector of claim 5, wherein each transfer electrical switch of the transfer electrical switches (i), i=1, ..., N comprises a transistor.

7. The radiation detector of claim 1,
wherein, for i=1, ..., N, during a non-transfer non-accumulation period (i) immediately before the transfer period (i), the first switching device is configured to (a) electrically connect the pixel (1,i) to ground and (b) electrically disconnect the pixel (1,i) from the first signal processing circuit.

8. The radiation detector of claim 7,
wherein the first switching device comprises ground electrical switches (i), i=1, ..., N, and
wherein for i=1, ..., N, the ground electrical switch (i), when being on, is configured to electrically connect the pixel (1,i) to ground.

9. The radiation detector of claim 1, further comprising a shutter which is configured to expose the pixels (1,j), j=1, ..., N to an incident radiation during an open shutter time window which is before the transfer periods (i), i=1, ..., N.

10. A method of operating a radiation detector, comprising:
for i=1, ..., N, during a transfer period (i), electrically connecting pixel (1,i) of pixels (1,j), j=1, ..., N of the radiation detector to a first signal processing circuit while electrically disconnecting the other N−1 pixels of the pixels (1,j), j=1, ..., N from the first signal processing circuit; and
for i=1, ..., N, during the transfer period (i), transferring electrical signals from the pixel (1,i) to the first signal processing circuit;
for i=1, ..., N, during the transfer period (i), electrically connecting pixel (2,i) of pixels (2,j), j=1, ..., N of the radiation detector to a second signal processing circuit while electrically disconnecting the other N−1 pixels of the pixels (2,j), j=1, ..., N from the second signal processing circuit; and
for i=1, ..., N, during the transfer period (i), transferring electrical signals from the pixel (2,i) to the second signal processing circuit.

11. The method of claim 10, wherein said electrically connecting while electrically disconnecting and said transferring for i=1, ..., N are performed K times in a round-robin manner, K being an integer greater than 1.

12. The method of claim 10, wherein the first processing circuit comprises an analog-to-digital converter.

13. The method of claim 10, further comprising:
opening a shutter of the radiation detector during an open shutter time window before the transfer periods (i), i=1, ..., N; and
exposing the pixels (1,j), j=1, ..., N to an incident radiation through the shutter during the open shutter time window.

14. The method of claim 10, further comprising using an electronics system of the radiation detector to process (a) the electrical signals from the pixels (1,j), j=1, ..., N and (b) other electrical signals from other pixels of the radiation detector to form an image of a scene.

15. The method of claim 10,
wherein the radiation detector comprises a first switching device, and
wherein for i=1, ..., N, during the transfer period (i), said electrically connecting while electrically disconnecting comprises using the first switching device to electrically connect the pixel (1,i) to the first signal processing circuit while causing the first switching device to not electrically connect the other N−1 pixels of the pixels (1,j), j=1, ..., N to the first signal processing circuit.

16. The method of claim 15, wherein the first signal processing circuit is electrically connected to the first switching device via a solder ball.

17. The method of claim 15,
wherein the first switching device comprises transfer electrical switches (j), j=1, ..., N,
wherein, for i=1, ..., N, the transfer electrical switch (i), when being on, is configured to electrically connect the pixel (1,i) to the first signal processing circuit, and
wherein, for i=1, ..., N, said using while causing the first switching device during the transfer period (i) comprises turning on the transfer electrical switch (i) while turning off the other N−1 transfer electrical switches of the transfer electrical switches (j), j=1, ..., N during the transfer period (i).

18. The method of claim 15, further comprising, for i=1, ..., N, during a non-accumulation non-transfer period (i) immediately before the transfer period (i), using the first switching device to (a) electrically connect the pixel (1,i) to ground and (b) electrically disconnect the pixel (1,i) from the first signal processing circuit.

19. The method of claim 18,
wherein the first switching device comprises ground electrical switches (i), i=1, ..., N, and
wherein for i=1, ..., N, said using the first switching device during the non-accumulation non-transfer period (i) comprises turning on the ground electrical switch (i) during the non-accumulation non-transfer period (i) so as to electrically connect the pixel (1,i) to ground.

* * * * *